(12) United States Patent
Choi et al.

(10) Patent No.: US 7,172,106 B2
(45) Date of Patent: Feb. 6, 2007

(54) PRINTED CIRCUIT BOARD WHICH CAN BE CONNECTED WITH PIN CONNECTOR AND METHOD OF MANUFACTURING THE PRINTED CIRCUIT BOARD

(75) Inventors: Jong-Soo Choi, Seoul (KR); Byung-Man Kim, Chungcheongnam-do (KR); Joung-Rhang Lee, Seoul (KR); Chang-Yong Park, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 288 days.

(21) Appl. No.: 10/748,868

(22) Filed: Dec. 29, 2003

(65) Prior Publication Data

US 2004/0222016 A1   Nov. 11, 2004

(30) Foreign Application Priority Data

Dec. 30, 2002   (KR) .............................. 2002-87239

(51) Int. Cl.
*B23K 31/00*   (2006.01)
(52) U.S. Cl. .................................... 228/248.1; 228/223
(58) Field of Classification Search ............. 228/248.1, 228/223
See application file for complete search history.

(56) References Cited

U.S. PATENT DOCUMENTS

| | | | | |
|---|---|---|---|---|
| 4,979,015 A | * | 12/1990 | Stierman et al. | 257/778 |
| 5,394,609 A | * | 3/1995 | Ferguson et al. | 29/840 |
| 5,489,804 A | * | 2/1996 | Pasch | 257/778 |
| 5,622,304 A | * | 4/1997 | Sato | 228/44.7 |
| 5,644,839 A | | 7/1997 | Stone | |
| 5,676,561 A | * | 10/1997 | Chiang | 439/328 |
| 5,755,586 A | * | 5/1998 | Knighton et al. | 439/328 |
| 6,079,991 A | * | 6/2000 | Lemke et al. | 439/83 |

(Continued)

FOREIGN PATENT DOCUMENTS

JP          62203669 A   *   9/1987

(Continued)

OTHER PUBLICATIONS

English language of Abstract for Japanese patent publication No. JP2001-23738, published on Jan. 10, 2001.

(Continued)

*Primary Examiner*—Jonathan Johnson
*Assistant Examiner*—Rachel E. Beveridge
(74) *Attorney, Agent, or Firm*—Marger Johnson & McCollom, P.C.

(57) ABSTRACT

A printed circuit board that can be connected with a pin connector and a method of manufacturing the printed circuit board are provided. Solidified solder can be formed on the tap unit without the need for additional processes, by applying solder printing to the tap unit at the same time it is applied to pads of the printed circuit board and, for example, by performing high temperature reflow. In addition, reliability and reduction in cost of a pin connector can be ensured without using a pin connector into which a high-priced wired solder is inserted. Rather a general pin connector can be used because the pin connector and the tap unit are connected to each other through the solidified solder formed on the tap unit.

9 Claims, 4 Drawing Sheets

U.S. PATENT DOCUMENTS

| | | | |
|---|---|---|---|
| 6,396,558 B1 * | 5/2002 | Kim et al. | 349/152 |
| 6,482,029 B2 * | 11/2002 | Nishimura | 439/541.5 |
| 6,780,028 B1 * | 8/2004 | Kennedy et al. | 439/83 |
| 2006/0103303 A1 * | 5/2006 | Kim et al. | 313/512 |

FOREIGN PATENT DOCUMENTS

| | | |
|---|---|---|
| JP | 4155990 | 5/1992 |
| JP | 2001-23738 | 1/2001 |

OTHER PUBLICATIONS

English language abstract of Japanese Publication No. JP4155990, no date avail.

* cited by examiner 10  10  10  10  10  10

20

(a)

(b)

PRINTED CIRCUIT BOARD WHICH CAN BE CONNECTED WITH PIN CONNECTOR AND METHOD OF MANUFACTURING THE PRINTED CIRCUIT BOARD

CROSS REFERENCE TO RELATE APPLICATIONS

This application claims priority from Korean Patent Application No. 2002-87239, filed on 30 Dec. 2002, in the Korean Intellectual Property Office, the contents of which are hereby incorporated by reference in their entirety.

BACKGROUND OF THE INVENTION

1. Field of the Invention

This disclosure relates to a printed circuit board, and more particularly, to a printed circuit board and a method of manufacturing the printed circuit board.

2. Description of the Related Art

In general, the printed circuit board of FIG. 1 is inserted into a socket of a main board without a pin connector being mounted on a tap unit 10. However, in a printed circuit board which requires high reliability of the main board, a tap and a pin connector of the printed circuit board are connected to each other by soldering.

The tap and a pin connector may be connected using wired solder or cored solder 20, as shown in FIG. 2, that is mechanically inserted into a junction area where the tap and the pin connector of the printed circuit board are in contact with each other.

FIG. 3A is a side view of a wired solder pin connector where wired solder is inserted inside of a junction area of the pin connector of FIG. 2. FIG. 3B is a plan view of the wired solder pin connector of FIG. 3A.

In order to insert the wired solder into the junction area of the pin connector, high-priced metal patterns must be developed. Moreover, a method of manufacturing the pin connector becomes very complicated, causing an increase in the price of the pin connector. Thus, it is difficult to mass-produce the wired solder pin connector.

SUMMARY OF THE INVENTION

Embodiments of the invention provide a printed circuit board that can be connected with a pin connector by performing solder screen printing in a tap of the printed circuit board.

Embodiments of the invention also provide a method of manufacturing a printed circuit board that can be connected with a pin connector.

Embodiments of the invention also provide a recording medium having embodied thereon a computer program for a method of manufacturing the printed circuit board.

According to an embodiment of the invention, there is provided a printed circuit board that can be connected with a pin connector. The printed circuit board includes a printed circuit unit and a tap unit. On the printed circuit unit, pads are formed to mount chips to one another or to other electrical components, the pads being electrically connected to one another. The tap unit is electrically connected to the printed circuit unit and has solidified solder formed thereon. The tap unit can be connected using an external pin connector.

According to another embodiment of the invention, there is provided a method of manufacturing a printed circuit board that can be connected with a pin connector. The method includes applying solder screen printing to a tap unit on a first side of the printed circuit board, solidifying solder printed in the tap unit on the first side of the printed circuit board, applying solder screen printing to the tap unit on a second side of the printed circuit board, and solidifying solder printed in the tap unit on the second side of the printed circuit board.

BRIEF DESCRIPTION OF THE DRAWINGS

The above and other features and advantages of the present invention will become more apparent by describing in a detail exemplary embodiment thereof with reference to the attached drawings.

DETAILED DESCRIPTION OF THE INVENTION

The invention now will be described more fully with reference to the accompanying drawings, in which a preferred embodiment of the invention is shown.

Figure 1:
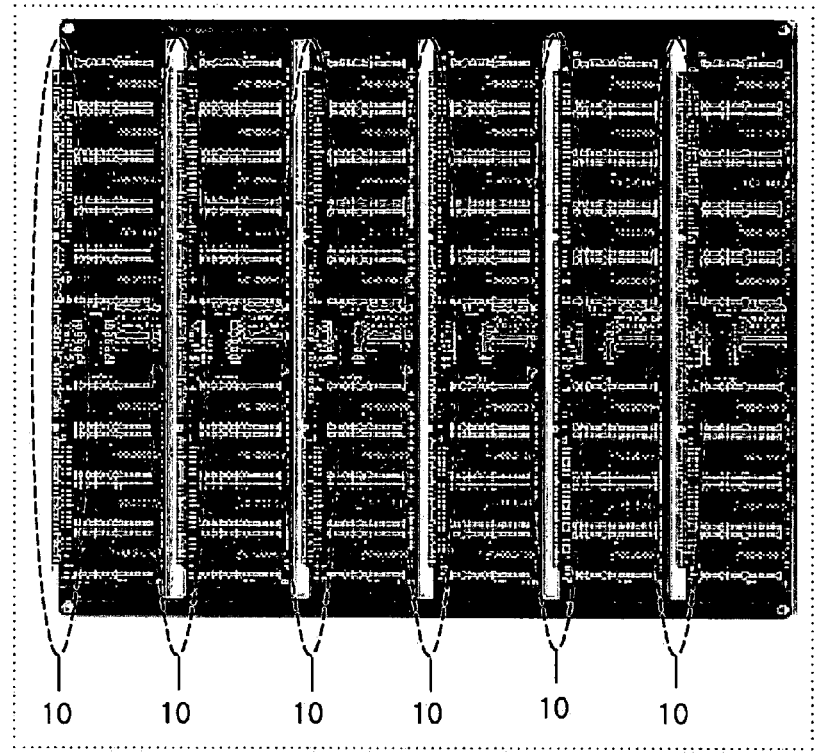
FIG. 1 is a plan view of a conventional printed circuit that is inserted into a socket of a main board without a pin connector being mounted on a printed circuit board.
Figure 2:
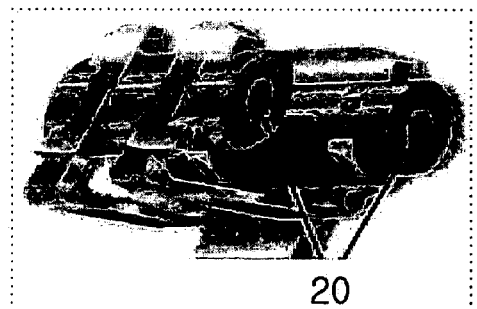
FIG. 2 is a sectional view of a conventional pin connector where wired solder or cored solder is mechanically inserted into a junction area connected with a tap unit.
Figure 3:
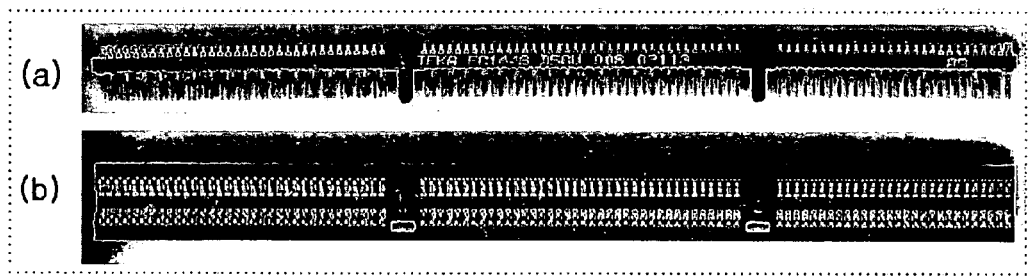
FIG. 3A is a side view of a wired solder pin connector where wired solder is inserted into a metal of a junction area of the pin connector of FIG. 2.
FIG. 3B is a plan view of the wired solder pin connector where wired solder is inserted into a metal of a junction area of the pin connector of FIG. 2.
Figure 4:
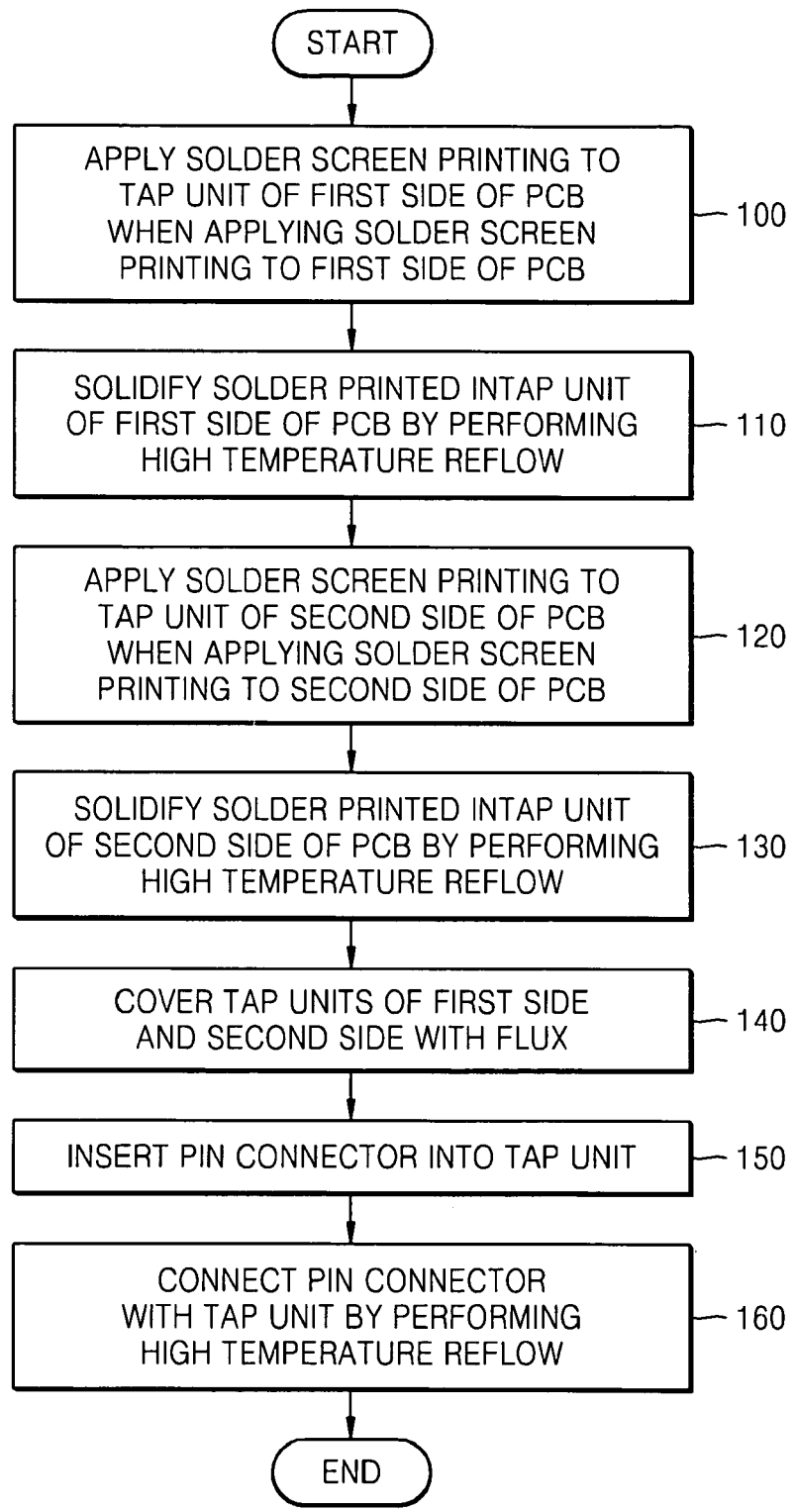
FIG. 4 is a flowchart illustrating a method of manufacturing a printed circuit board that can be connected with a pin connector, according to an embodiment of the invention.

FIG. 4 is a flowchart illustrating a method of manufacturing a printed circuit board that can be connected with a pin connector, according to an embodiment of the invention.

Figure 5:
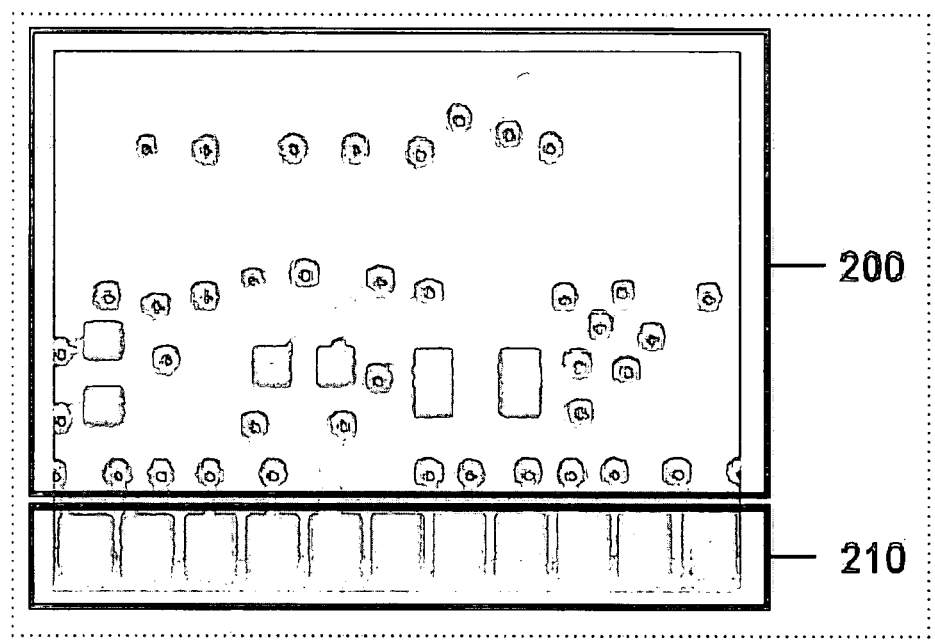
FIG. 5 is a view of a printed circuit board before a solder screen printing process is performed.
Figure 6:
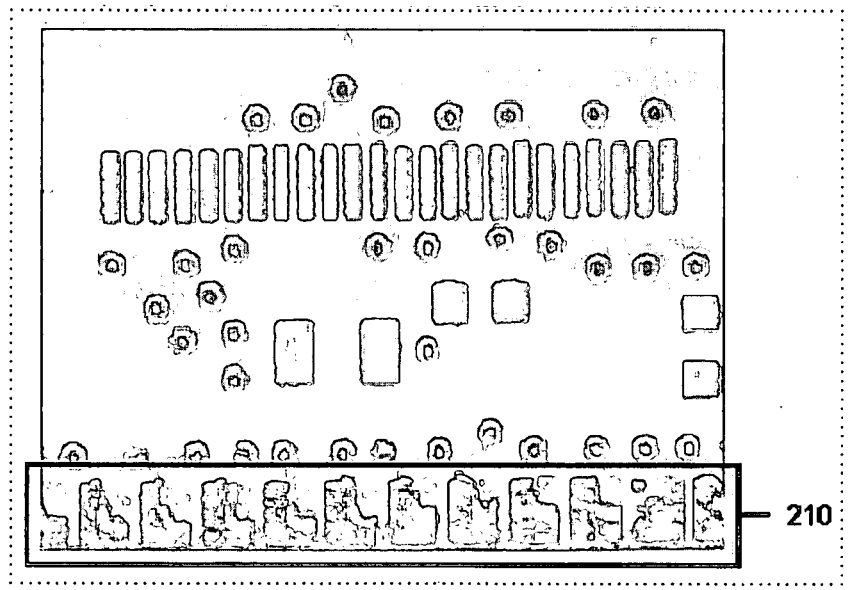
FIG. 6 is a view of a printed circuit board where solidified solder is formed on a tap unit by performing a solder screen printing process.

FIG. 5 is a view of a printed circuit board before a solder screen printing process is performed. In general, the printed circuit board includes a printed circuit unit 200 and a tap unit 210. Pads are formed on the printed circuit unit 200 so that chips or other electrical components can be mounted on the printed circuit unit 200. The pads are electrically connected to one another. The tap unit 210 is electrically connected with the printed circuit unit 200 and with an external pin connector. In FIG. 5, solder has not been yet formed on the pads and the tap unit 210. In addition, FIG. 5 shows a first side of the printed circuit board to which a surface mount technology (SMT) is applied.

Referring to FIGS. 4 and 5, when both sides of a printed circuit board undergo a SMT application, a solder screen printing is applied to the tap unit 210 of the first side (step 100). Step 100 can be performed when solder screen printing is applied to surfaces of pads on the first side of the printed circuit unit 200. By applying solder screen printing to the tap unit 210 in step 100 while applying solder screen printing to surfaces of the pads, an additional process is not required to apply solder screen printing to the tap unit 210 of the first side.

After step 100, high temperature reflow is performed to solidify solder printed on the tap unit 210 of the first side (step 110). When high temperature reflow is performed after chips and electrical components are mounted on the printed circuit unit 200, it is possible to solidify the solder printed in the tap unit 210. Therefore, an additional process is not required to solidify the solder printed in the tap unit 210.

After step 110, solder screen printing is applied to the tap unit 210 on a second side of the printed circuit board of FIG. 5 (step 120). Step 120 can be performed when solder screen printing is applied to surfaces of pads on the second side of the printed circuit unit 200. Likewise, by applying solder screen printing to the tap unit 210 in step 120 while applying solder screen printing to surfaces of the pads, an additional process is not required to apply solder screen printing to the tap unit 210 of the second side.

After step 120, high temperature reflow is performed to solidify solder printed on the tap unit 210 (step 130). When high temperature reflow is performed after chips and electrical components are mounted in the printed circuit unit 200 of the second side, it is possible to solidify the solder printed on the tap unit 210. Therefore, an additional process is not required to solidify the solder printed in the tap unit 210.

By performing steps 100 through 130, solidified solder can be formed on the tap unit 210 of the printed circuit board.

After step 130, flux is used to cover the tap unit 210 on both the first side and the second side where the solidified solders are formed to facilitate connection of the tap unit 210 with the pin connector (step 140). The flux can cover the junction area of the pin connector where the pin connector and the tap unit are connected to each other.

After step 140, a pin connector is inserted into the tap unit 210 covered with flux (step 150). Then, the pin connector is connected with the tap unit 210, by performing high temperature reflow (step 160).

Figure 7A:
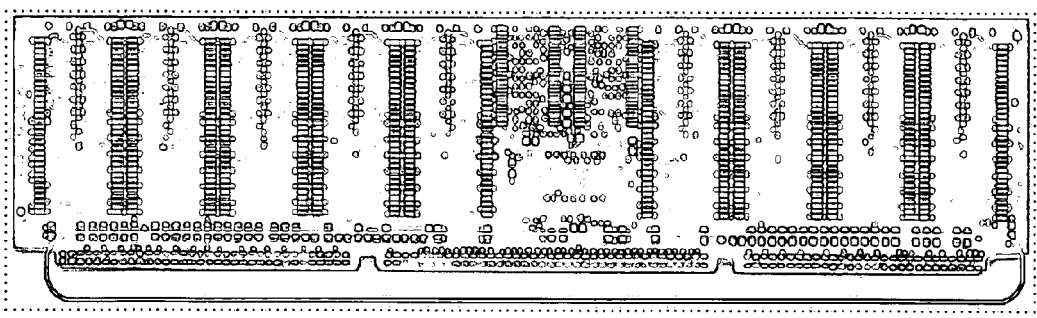
FIG. 7A is a view of a printed circuit board where solidified solder is formed on a tap unit.
Figure 7B:
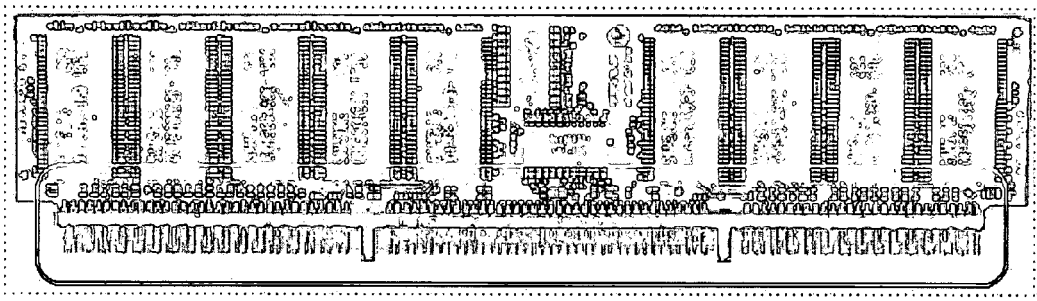
FIG. 7B is a view of a printed circuit board where a tap unit is connected with a pin connector.

FIGS. 7A and 7B show a process of connecting the tap unit of the printed circuit board with the pin connector. FIG. 7A is a view of a printed circuit board where solidified solder is formed on a tap unit. FIG. 7B is a view of a printed circuit board where a tap unit is connected with a pin connector.

As described above, after solder is printed on the tap unit when the solder is printed on the pads of the printed circuit board, solidified solder can be formed on the tap unit by performing high temperature reflow without the need for a separate process. The pin connector and the tap unit can be connected to each other through the solidified solder formed in the tap unit. That is, the solidified solder connects the tap unit with the pin connector in the same manner as in prior art where the wired solder is inserted into the pin connector. Therefore, a general pin connector can be connected to the tap unit, as opposed to a pin connector into which a high-priced wired solder is inserted, while ensuring high reliability. Thus, the price of the pin connector can be reduced.

The invention may also be embodied as a computer readable code in a computer readable recording medium. The computer readable recording medium may be any type of recording device where computer readable data is stored, and includes but is not limited to ROM, RAM, CD-ROM, magnetic tape, a floppy disk, an optical data storage medium, or carrier waves (e.g., transmissions over the Internet). The computer readable recording medium may be distributed to a computer system connected via a network, and the computer readable code can be stored and run by a distribution method.

As described above, according to an embodiment of the invention, solidified solder can be formed in a tap unit without needing additional process, by applying solder printing to the tap unit when applying it to pads of the printed circuit board and by performing high temperature reflow. In addition, reliability and reduction in cost of a pin connector can be ensured without using a pin connector into which high-priced wired solder is inserted but rather by using a general pin connector because the pin connector and the tap unit are connected to each other through the solidified solder formed in the tap unit.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of manufacturing a printed circuit board that can be connected with a pin connector, the method comprising:

applying a first solder screen printing to a tap unit on a first side of the printed circuit board;

solidifying the first solder screen printing;

applying a second solder screen printing to the tap unit on a second side of the printed circuit board;

solidifying the second solder screen printing; and inserting the pin connector into the tap unit and connecting the pin connector to the tap unit.

2. The method of claim 1, wherein inserting the pin connector into the tap unit and connecting the pin connector to the tap unit comprises:

covering the tap unit with flux;

inserting the pin connector into the tap unit; and connecting the pin connector to the tap unit by performing high temperature reflow.

3. The method of claim 1, wherein inserting the pin connector into the tap unit and connecting the pin connector to the tap unit comprises:

covering a junction area of the pin connector with flux, wherein the junction area is connected to the tap unit where the solder has solidified;

inserting the pin connector into the tap unit where the solder has solidified; and connecting the pin connector to the tap unit by performing high temperature reflow.

4. The method of claim 1, wherein applying the first solder screen printing to the tap unit on the first side of the printed circuit board is performed when the first solder screen printing is applied to pads on the first side of the printed circuit board on which electrical components are to be mounted.

5. The method of claim 1, wherein applying a second solder screen printing to the tap unit on a second side of the printed circuit board is performed when solder screen printing is applied to pads on the second side of the printed circuit board on which electrical components are to be mounted.

6. The method of claim 1, wherein solidifying the first solder screen printing comprises performing high temperature reflow.

7. The method of claim 6, wherein solidifying the first solder screen printing is performed when high temperature reflow is performed after mounting the electrical components on the first side of the printed circuit board.

8. The method of claim 1, wherein solidifying the second solder screen printing comprises performing high temperature reflow.

9. The method of claim 8, wherein solidifying the second solder screen printing is performed when high temperature reflow is performed after mounting the electrical components on the second side of the printed circuit hoard.

\* \* \* \* \*

UNITED STATES PATENT AND TRADEMARK OFFICE
CERTIFICATE OF CORRECTION

PATENT NO. : 7,172,106 B2  Page 1 of 1
APPLICATION NO. : 10/748868
DATED : February 6, 2007
INVENTOR(S) : Jong-Soo Choi et al.

It is certified that error appears in the above-identified patent and that said Letters Patent is hereby corrected as shown below:

Column 4, line 65, the word "hoard" should read -- board --.

Signed and Sealed this

Twenty-sixth Day of August, 2008

JON W. DUDAS
*Director of the United States Patent and Trademark Office*